United States Patent [19]

Ohno

[11] Patent Number: 4,903,071
[45] Date of Patent: Feb. 20, 1990

[54] IMAGE FORMING SYSTEM USING A PHOTOSENSITIVE MEDIUM

[75] Inventor: Motoshi Ohno, Nagoya, Japan

[73] Assignee: Brother Kogyo Kabushiki Kaisha, Aichi, Japan

[21] Appl. No.: 167,199

[22] Filed: Mar. 11, 1988

[30] Foreign Application Priority Data

Mar. 17, 1987 [JP] Japan .................................. 62-38959

[51] Int. Cl.⁴ ........................ G03B 27/32; G03B 27/52
[52] U.S. Cl. ........................................ 355/27; 430/138
[58] Field of Search ................. 355/3 TR, 27, 50, 51; 430/138, 211, 235, 962; 354/302–304, 319, 301

[56] References Cited

U.S. PATENT DOCUMENTS

| | | | |
|---|---|---|---|
| 4,624,560 | 11/1986 | Beery | 355/27 |
| 4,648,699 | 3/1987 | Holycross et al. | 355/27 X |
| 4,714,943 | 12/1987 | Sakakibara et al. | 355/27 |
| 4,727,392 | 2/1988 | Stone et al. | 355/27 X |
| 4,740,809 | 4/1988 | Yamamoto et al. | 355/27 |
| 4,742,374 | 5/1988 | Yamamoto et al. | 355/27 |
| 4,768,050 | 8/1988 | Beery | 355/27 X |
| 4,782,364 | 11/1988 | Takagi | 355/27 X |
| 4,785,332 | 11/1988 | Nagumo et al. | 355/27 |

*Primary Examiner*—Richard A. Wintercorn
*Attorney, Agent, or Firm*—Oliff & Berridge

[57] ABSTRACT

An image forming system for forming images by using a pressure-sensitive photosensitive medium having a surface coated with a photosensitive material. The system includes an exposing device for exposing the surface of the photosensitive medium to a radiation and thereby forming a latent image thereon according to an amount of exposure of the medium to the radiation, a developing device having a first and a second member which cooperate with each other to press the exposed medium therebetween and thereby develop the latent image into a visible image, and a rotatably supported endless belt which passes between the second member of the developing device and the photosensitive medium, and thereby inhibit a direct contact of the second member with the surface of the photosensitive medium.

9 Claims, 2 Drawing Sheets

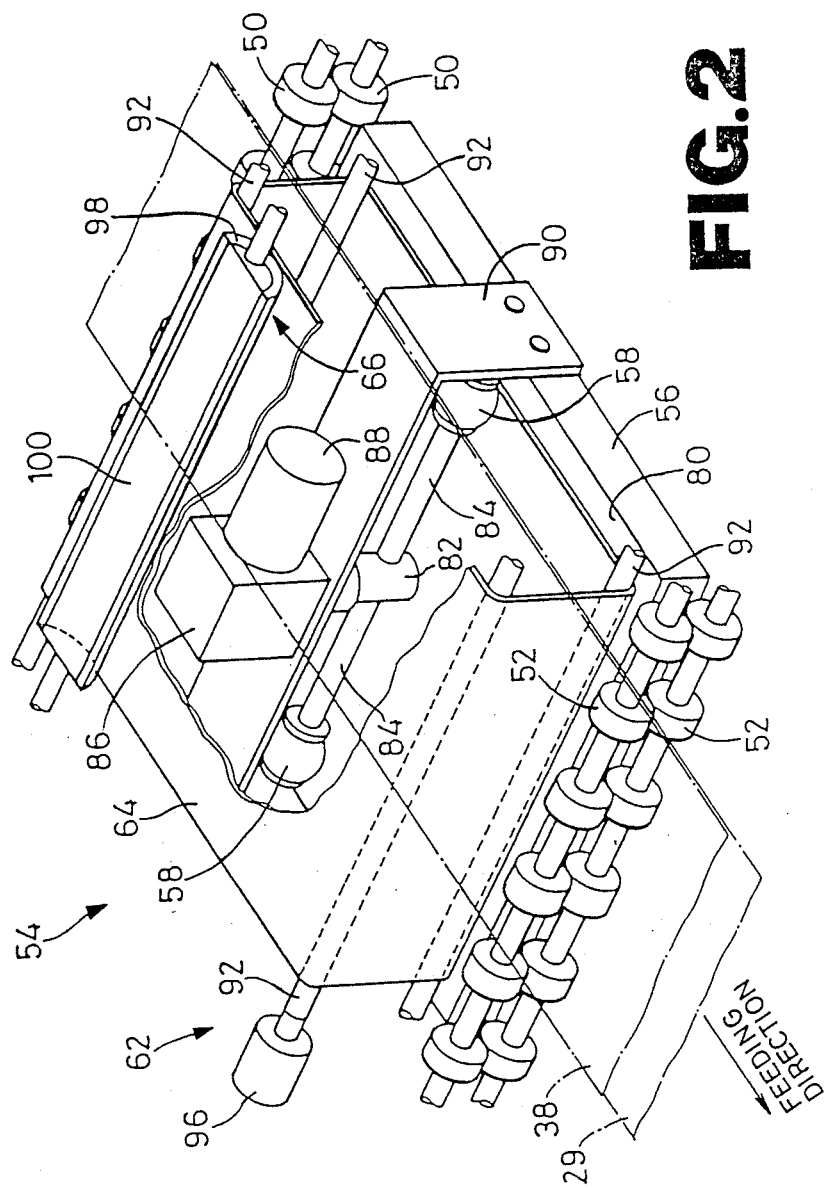

IMAGE FORMING SYSTEM USING A PHOTOSENSITIVE MEDIUM

BACKGROUND OF THE INVENTION

1. Field of the Invention

This invention relates to an image forming, transferring or recording system which utilizes a pressure-sensitive photosensitive medium having a surface coated with a photosensitive material. More particularly, the present invention is concerned with such an image forming system which includes an exposing device for irradiating the photosensitive surface of the photosensitive medium with a radiation and thereby forming a latent image on the photosensitive surface according to an amount of exposure of the surface to the radiation, and which further includes a developing device in the form of a pressing device having a first and a second member which cooperate with each other to press or squeeze the exposed medium therebetween, for thereby developing the latent image into a visible image.

2. Discussion of the Prior Art

A known image forming system of the type indicated above uses, for example, a photosensitive material and a developer material which are capable of chemically reacting with each other and producing a color image. Described more specifically, the latent image is developed into a visible image by the chemical reaction between the photosensitive and developer materials. This developing process is carried out by the developing device, which is adapted to apply a pressure to the photosensitive medium and thereby causing the photosensitive and developer materials to be mixed with each other, for chemical reaction therebetween. The developer material may be provided as a developer layer on the photosensitive medium which has a photosensitive layer made of the photosensitive material. Alternatively, the developer material is provided on a separate developer medium. In this latter case, the developer medium is superposed on the photosensitive medium such that the developer layer and the photosensitive layer of the two media are held in contact with each other. The superposed two media are then pressed by the developing device, for chemical reaction between the developer and photosensitive materials for producing a visible image. In the former case wherein the photosensitive medium also has the developer layer, the visible image is formed on the photosensitive medium. In the latter case, the visible image is created on the developer medium, which serves as a recording medium.

In the former case where the photosensitive medium has a developer layer, one of the first and second members of the developing or pressing device directly contacts the photosensitive surface of the medium. In the latter case where a separate developer medium is used, one of the first and second members of the pressing device indirectly contacts the photosensitive medium via the developer medium superposed thereon. Since the photosensitive medium usually has a larger surface area than the developer medium, the photosensitive medium has a portion which is left uncovered. Therefore, the first or second member of the pressing device directly contacts the uncovered portion of the photosensitive medium. Thus, in either case, the photosensitive material inevitably adheres to the first or second member of the pressing device during the developing process. In the former case, the photosensitive material soils the photosensitive surface of the photosensitive medium on which the visible images are formed. In the latter case, the photosensitive material adheres to the back surface of the developer medium opposite to its surface (developer layer) contacting the photosensitive surface of the photosensitive medium. Hence, it is necessary to wipe off the photosensitive material from the first or second member of the pressing device.

However, the cleaning procedure to wipe off the photosensitive material from the presser member is cumbersome and time-consuming, particularly where the presser member has a curved pressure surface, or a complicated construction that prevents easy cleaning of the pressure surface. If the cleaning of the presser member is automatically cleaned, the cleaning operation requires a relatively complicated cleaning device.

The cleaning job is particularly troublesome where the developing or pressing device uses a presser member having a relatively narrow contact area or a contact point, which is moved at a high speed in contact with the surface of the photosensitive medium, so that the path taken by the contact area or point covers the entire surface area of the photosensitive medium. In this case, the narrow contact area or contact point is heavily contaminated with the photosensitive material transferred from the photosensitive medium. Consequently, the photosensitive surface of the photosensitive medium, or the back surface of the developer medium is locally heavily soiled with the photosensitive material adhering to the presser member.

SUMMARY OF THE INVENTION

It is therefore an object of the present invention to provide an image forming system using a pressure-sensitive, photosensitive medium, which system has means for minimizing the contamination of a presser member of the developing device with the photosensitive material.

Another object of the invention is to provide an image forming system which has means for facilitating the cleaning of the presser member.

The above objects may be achieved according to the principle of the present invention, which provides an image forming system comprising: a pressure-sensitive photosensitive medium having a surface coated with a photosensitive material; exposing means for exposing the surface of the photosensitive medium to a radiation and thereby forming a latent image thereon according to an amount of exposure of the medium to the radiation; a developing device including a first and a second member which cooperate with each other to press the exposed medium therebetween and thereby develop the latent image into a visible image; an endless belt which passes between the second member of the developing device and the photosensitive medium, and thereby inhibit a direct contact of the second member with the surface of the photosensitive medium; and belt driving means for rotating the endless belt. For example, the endless belt is formed from a steel sheet.

In the image forming system of the present invention as described above, a latent image is formed on the photosensitive medium by exposure of the photosensitive material to a radiation which is produced by the exposing means and which serves as an optical signal representative of desired source image information. Then, the photosensitive medium is pressed by and between the first and second members of the developing means, whereby the photosensitive material chemically reacts with a developer material, to produce a visible image corresponding to the latent image. Described more specifically, where the developer material is provided on the photosensitive medium, this medium is pressed by the first and second members of the developing means. Where the developer material is provided on a separate developer medium, the photosensitive medium and the separate developer medium are superposed on each other, and the two superposed media are pressed by the developing means. In either case, the pressure applied to the photosensitive medium causes the photosensitive material to contact the developer material, whereby the photosensitive and developer materials chemically react with each other.

In the former case where the photosensitive medium has both the photosensitive material and the developer material, the second member of the developing means indirectly contacts the surface (hereinafter referred to as "photosensitive surface") of the photosensitive medium coated with the photosensitive material, via the endless belt. In the latter case where the separate developer medium is used, the second member indirectly contact via the endless belt a portion of the photosensitive surface of the photosensitive medium which is not covered by the separate developer medium. In both cases, therefore, the second member does not directly contact any portion of the photosensitive surface, whereby the endless belt protects the second member from the photosensitive material. In other words, the photosensitive material will not adhere to the second member of the developing means.

Where the endless belt is removable for replacement after a suitable time of use, the cleaning of the belt to remove the photosensitive material is not necessary. Even where the belt is adapted to be cleaned, the cleaning of the endless belt is easier than the cleaning of the second member of the developing device, since the endless belt is simpler in construction and configuration than the developing device or its second member. Further, the cleaning operation is not disturbed by the developing device or the surrounding components. Therefore, the cleaning of the belt can be efficiently and easily accomplished manually by the operator, or automatically by a simple, inexpensive cleaning device.

In the case where an automatic cleaning device is provided to continuously clean the endless belt, the cleaned portion of the endless belt always passes between the second member of the developing device and the photosensitive medium or separate developer medium. Consequently, the photosensitive medium or the separate developer medium will not directly contact the contaminated portion of the endless belt. If the endless belt is replaced or cleaned at a certain time interval, the photosensitive medium or separate developer medium will contact a comparatively reduced amount of the photosensitive material adhering to the endless belt. Thus, the latent image formed on the photosensitive medium can be developed into the visible image, without the visible image contaminated by the photosensitive material, or with only a small degree of contamination of the visible image with the photosensitive material.

The cleaning device may be adapted to operate to wipe, wash or otherwise remove the photosensitive material from the endless belt, after each predetermined time of use of the endless belt, or as the belt is rotated by the belt driving means. The cleaning device may comprise cleaning means for cleaning the surface of the endless belt, and supporting means for holding the cleaning means in contact with the surface of the endless belt, to enable the cleaning means to clean the surface of the endless belt as the belt is rotated. The cleaning means may be a cleaning member made of a felt, and the supporting means may be adapted to removably support the cleaning member.

The first member of the developing device may be a table having a substantially flat bearing surface, and the second member of the developing device may be a rolling member having a substantially spherical surface which cooperates with the bearing surface of the first member to pinch the photosensitive medium therebetween. The rolling member is moved along a circular path while the rolling member and the table are biased toward each other. In this case, the belt driving means may include a pair of rolls which are rotatably disposed parallel to each other. The rolls are spaced apart from each other by a distance larger than a diameter of the circular path taken by the rolling member. The pair of rolls supports a portion of the endless belt so that the portion extends substantially parallel to the bearing surface of the table.

The instant image forming system may use a recording medium in addition to the photosensitive medium. In this case, the recording medium is superposed on the photosensitive medium such that the recording medium is held in contact with a portion of the surface of the photosensitive medium coated with the photosensitive material. The first and second members of the developing device press the superposed recording medium and photosensitive medium, so as to develop the latent image on the surface of the photosensitive medium, into the visible image formed on the recording medium. In the present arrangement, the endless belt indirectly contacts the above-indicated portion of the surface of the photosensitive medium via the recording medium, and directly contacts an exposed portion of the surface of the photosensitive medium which is left uncovered by the recording medium. Generally, the recording medium consists of a developer sheet which has a developer layer containing a developer material which is capable of chemically reacting with the photosensitive material of the photosensitive medium, and thereby producing the visible image.

BRIEF DESCRIPTION OF THE DRAWINGS

The above and other objects, features and advantages of the present invention will be better understood by reading the following detailed description of a presently preferred embodiment of the invention, when considered in conjunction with the accompanying drawings, in which:

FIG. 2 is a fragmentary perspective view showing a developing device of the system of FIG. 1, and components neighboring the developing device.

DETAILED DESCRIPTION OF THE PREFERRED EMBODIMENT

Figure 1:
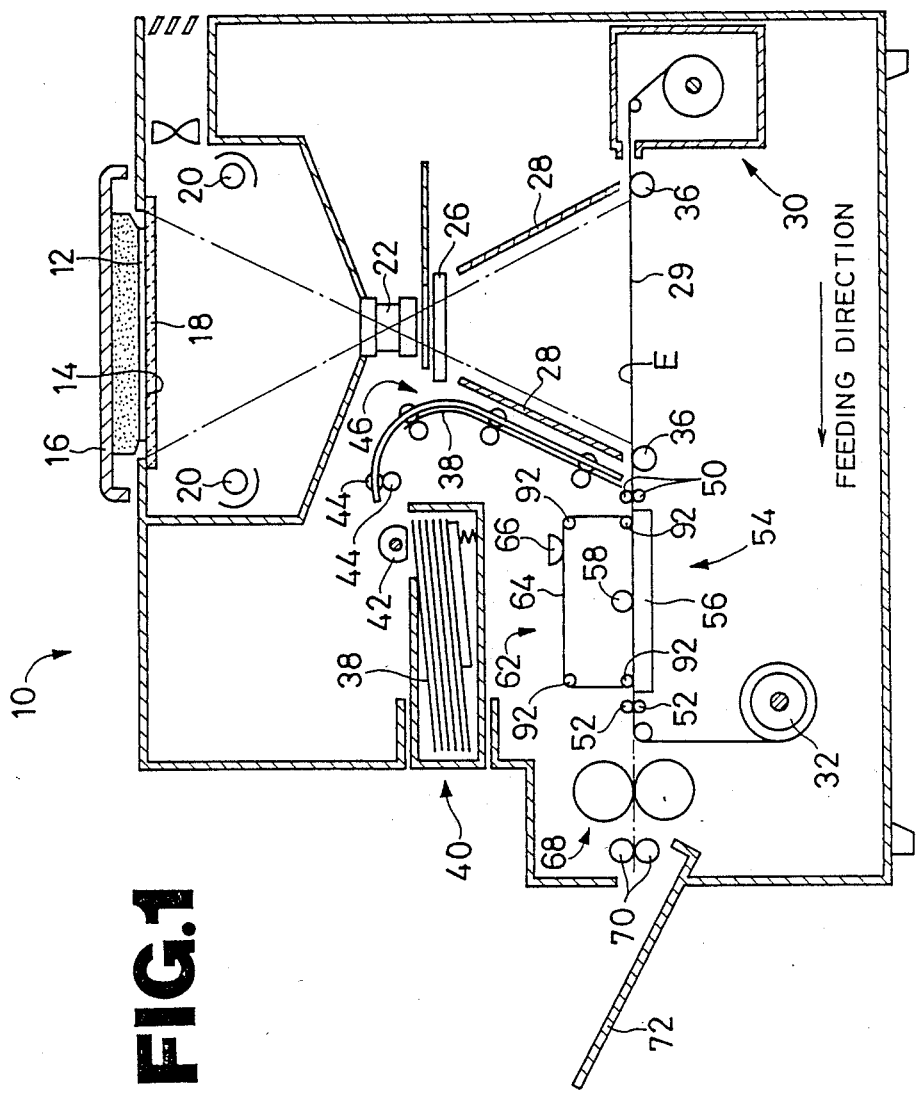
FIG. 1 is a front elevational view in cross section of the presently preferred embodiment of an image forming system of the present invention.

Referring first to the front elevational cross sectional view of FIG. 1, the image forming system is indicated generally at 10. The system 10 uses an original 12 in the form of a sheet having a surface 14 which bears desired images as source image information. The original 12 is held in place on a support glass plate 18, by a covering member 16, such that the surface 14 is held in pressed contact with the glass plate 18. The image forming system 10 has lamps 20 which serve as a light source for producing a radiation to irradiate the surface 14 of the original 12. The radiation is reflected by the surface 14, such that the amount of the reflected radiation from local areas of the surface 14 varies depending upon whether the local areas contain images or not. The reflected radiation travels through a lens 22 and a shutter 26 disposed below the glass plate 18, and reach an exposing area E in the system. Thus, the images on the original 12 are optically focused on the exposing area E. The shutter 26 cooperates with a shielding hood 28, to protect the exposing area E from any rays of light, when an exposing operation is not performed in the area E. In the present embodiment, the light source lamps 20, lens 22, shutter 26 and hood 28 constitute exposing means for exposing a pressure-sensitive photosensitive medium 29.

The photosensitive medium 29 is supplied from a roll accommodated in a storage 30 located upstream of the exposing area E (to the right of the area E in FIG. 1). The medium 29 is fed by a take-up roll 32 located downstream of the exposing area E, such that the medium 29 passes through the exposing area E while being guided by guide rolls 36, so as to extend parallel to the surface 14 of the original 12. The photosensitive medium 29 has a photosensitive layer which contains a suitable radiation-sensitive material. The medium 29 is oriented such that the photosensitive layer is exposed to the reflected radiation from the original 12 when the medium 29 passes through the exposing area E. With the photosensitive layer exposed to the reflected radiation, a latent image corresponding to the source image information on the surface 14 of the original 12 is formed on the photosensitive layer. Upon completion of the exposing operation in the exposing area E, the photosensitive medium 29 is fed by the take-up roll 32 by a distance corresponding to the exposed length, so that the following unexposed length of the medium 29 is positioned in the exposing area E.

The instant image forming system 10 uses a recording medium in the form of cut, developer sheets 38 separate from the photosensitive medium 29. Each developer sheet 38 has a developer layer which contains a suitable developer material which is capable of reacting with the photosensitive material on the photosensitive medium 29, and thereby producing a color image. The developer sheets 38 are accommodated in a stack in a removably mounted cartridge container 40. The developer sheets 38 are successively delivered one at a time from the container 40 by a feed roller 42, and is fed to a path of the photosensitive medium 29, by a feed mechanism 46 which incorporates feed rollers 44. Each developer sheet 38 fed from the container 40 is superposed on the exposed portion of the photosensitive medium 29 on which the latent image has been formed. The sheet 38 and the medium 29 are superposed such that the developer layer of the sheet 38 and the photosensitive layer of the medium 29 face each other, so that the developer material and the photosensitive material chemically react with each other in the following developing process.

Downstream of the feeding mechanism 46, there are disposed feed rollers 50, 52 which are spaced apart from each other along the path of the photosensitive medium 29 (developer sheet 38). The feed rollers 50, 52 pinch the superposed medium 29 and sheet 38, to feed them through a developing device 54 disposed between the rollers 50, 52, in a direction away from the exposing area E. The developing device 54 includes a first member in the form of a table 56 which is located on the side of the photosensitive medium 29, to support the superposed medium 29 and sheet 38. The developing device 54 further includes a second member in the form of a pair of rolling steel balls 58 which are disposed on the side of the developer sheet 38. The superposed medium 29 and sheet 38 pass through pressure nips between the steel balls 58 and the bearing surface of the table 56, so that a pressure is applied to the photosensitive layer of the medium 29, whereby the photosensitive material on the medium 29 and the developer material on the recording medium or developer sheet 38 are forced to contact each other. As a result, the two materials chemically react with each other, and produce a color image corresponding to the latent image which was formed on the photosensitive layer due to the exposure to the reflected radiation in the exposing area E. Thus, the latent image is developed into a corresponding visible image by the developing device 54.

The steel balls 58 are adapted to indirectly contact the superposed medium 29 and sheet 38, via an endless belt 64 formed of a thin steel sheet. The endless belt 64 is rotated by a belt driving device generally indicated at 62 in FIG. 1. The endless belt 64 is cleaned by a cleaning device 66, to wipe off the photosensitive material or other substance which adheres to the surface of the belt 64 contacting the medium 29 and sheet 38.

Downstream of the feed rollers 52, a heating device 68 consisting of heat rolls is provided to heat the developed portion of the developer sheet or recording medium 38 to a suitable temperature, for fixing the developed visible image on the sheet 38. The sheet 38 is then discharged out of the housing of the system 10, by ejector rollers 70 provided at an outlet end of the housing. The discharged sheet 38 is received by a tray 72 provided near the ejector rollers 70.

Referring next to FIG. 2, the table 56, steel balls 58, belt driving device 62 and cleaning device 66 will be described in greater detail.

The table 56 has a flat bearing surface 80 for sliding contact with the photosensitive medium 29, and is secured to the frame of the system 10 such that the bearing surface 80 is parallel to the feed path of the photosensitive medium 29 and sheet 38.

The two steel balls 58 are rotatably supported respectively by a pair of arms 84 which extend radially from a support shaft 82 that is perpendicular to the superposed medium 29 and sheet 38. The balls 58 are rotatable about the centerlines of the arms 84. The shaft 82 is operatively connected to a drive motor 88 through a gear box 86. The gear box 86 is mounted on a support member 90 which has an inverted U shape. The support member 90 is secured at its opposite ends to the table 56. The gear box 86 incorporates suitable biasing means for biasing the shaft 82 axially toward the table 56, so as to produce a suitable surface pressure between the steel balls 58 and the bearing surface 80 of the table 56.

The belt driving device 62 has four parallel support rolls 92 which extend perpendicularly to the feeding or rotating direction of the endless belt 64. The four rolls 92 are disposed inside the loop of the endless belt 64, so as to define a substantially rectangular path of the endless belt 64. The lower two support rolls 92 are positioned a suitable small distance above the bearing surface 80 of the table 56, so that the endless belt 62 and the superposed medium 29 and sheet 39 may pass through a slight clearance between the lower two rolls 92 and the bearing surface 80. These two rolls 92 are spaced apart from each other in the feeding direction of the medium 29 and sheet 38, by a distance larger than a diameter of a circular path that is taken by the steel balls 58 when the shaft 82 is rotated. According to this arrangement, the lower support rolls 92 do not interfere with the steel balls 58. The upper two support rolls 92 are positioned so that the upper run of the endless belt 64 do not contact the drive motor 88 and gear box 86. One of the two upper support rolls 92 is positively driven by an electric motor 96 fixed to the frame of the system 10. The motor 96 is actuated to rotate the endless belt 64 so that the lower run of the belt which passes between the steel balls 58 and the sheet 38 is fed in the feeding direction of the sheet 38 (medium 29), as indicated in FIG. 2.

The cleaning device 66 has a cleaning member 98 made of a felt for wiping the surface of the endless belt 64 which contacts the superposed medium 29 and sheet 38. The cleaning member 98 is removably attached to a support member 100, which is fixed to the frame of the system 10. The support member 100 is biased toward the upper run of the endless belt 64, so that the cleaning member 98 is held in pressed contact with the upper run of the belt 64, with a surface pressure suitable for the cleaning member 98 to be able to wipe the belt 64 at its upper run.

The instant image forming system 10 is operated in the following manner:

When the surface 14 of the original 12 is irradiated by a radiation produced by the illuminating lamps 20, the radiation reflected by the surface 14 is focused by the lens 22 on the appropriate portion of the photosensitive medium 29 which is located in the exposing area E. The exposed portion of the medium 29 is fed by the feed rollers 50, 52 away from the exposing area E. At the same time, the developer sheet 38 is superposed on the exposed portion of the photosensitive medium 29. The superposed medium 29 and developer sheet 38 are fed into the developing device 54.

The superposed medium 29 and sheet 38 are pressed by the steel balls 58 against the bearing surface 80 of the table 56, while the steel balls 58 are moved at a high speed along the circular path whose diameter is smaller than the span of the lower two support rolls 92. With this pressed rolling contact of the steel balls 58 with the superposed medium 29 and sheet 38, the photosensitive and developer materials are mixed with each other, and thereby chemically react with each other, whereby the visible image corresponding to the latent image formed on the photosensitive medium 29 is created on the developer sheet 38 which serves as a recording medium. In this developing process, the steel balls 58 of the developing device 54 do not directly contact the superposed medium 29 and sheet 38, because of the endless belt 64 interposed therebetween. Hence, the steel balls 58 are not soiled by the photosensitive medium 29 or developer sheet 38. However, since the developer sheet 38 usually has a width which is slightly smaller than that of the photosensitive medium 29, the lateral end portions of the medium 29 are left uncovered by the developer sheet 38. Consequently, the photosensitive material in the uncovered end portions of the photosensitive medium 29 may adhere to the corresponding lateral end portions of the endless belt 64, particularly when the lateral end portions of the belt 64 are forced by the steel balls 58 against the corresponding portions of the medium 29, at two positions near the lower two support rolls 92. The thus partially contaminated or soiled endless belt 64 is rotated by the driving device 62, in the clockwise direction as viewed in FIG. 2, so that the soiled surface of the belt 64 is cleaned by the cleaning device 66. Thus, the endless belt 64 which is partially soiled at its lower run is cleaned at its upper run. Since the contamination of the belt 64 in one rotation is limited, the photosensitive medium 29 will not be soiled by the contaminated lower run of the belt 64.

While the present invention has been described in its presently preferred embodiment with a certain degree of particularity, it is to be understood that the invention is not limited to the details of the illustrated embodiment, and that the invention may be embodied with various changes, modifications and improvements, which may occur to those skilled in the art, in light of the foregoing description, without departing from the spirit and scope of the following claims. For instance, the steel balls 58 may be replaced by cylindrical roller or rollers, and the steel endless belt 64 may be made of a fabric, paper, synthetic resin or other material.

What is claimed is:

1. An image forming system comprising:
   a pressure-sensitive photosensitive medium having a surface coated with a photosensitive material;
   exposing means for exposing said surface of said photosensitive medium to a radiation and thereby forming a latent image thereon according to an amount of exposure of the medium to said radiation;
   a developing device including a first and a second member which cooperate with each other to press the exposed medium therebetween and thereby develop said latent image into a visible image;
   an endless belt which passes between said second member of the developing device and said photosensitive medium, and thereby inhibit a direct contact of said second member with said surface of the photosensitive medium; and
   belt driving means for rotating said endless belt.

2. An image forming system according to claim 1, further comprising a cleaning device for cleaning a surface of said endless belt which contacts said surface of said photosensitive medium.

3. An image forming system according to claim 2, wherein said cleaning device comprises cleaning means for cleaning said surface of said endless belt, and supporting means for holing said cleaning means in contact with said surface of the endless belt, to enable said cleaning means to clean said surface of the endless belt as said belt is rotated.

4. An image forming system according to claim 3, wherein said cleaning means comprises a cleaning member made of a felt, and said supporting means removably support said cleaning member.

5. An image forming system according to claim 1, wherein said endless belt is formed from a steel sheet.

6. An image forming system according to claim 1, wherein said first member of said developing device comprises a table having a substantially flat bearing surface, and said second member of the developing device comprises a rolling member having a substantially spherical surface which cooperates with said bearing surface of said first member to pinch said photosensitive medium therebetween, said developing device further including roller driving means for moving said roller member along a circular path, and biasing means for biasing said rolling member and said table toward each other.

7. An image forming system according to claim 6, wherein said belt driving means includes a pair of rolls which are rotatably disposed parallel to each other and which are spaced apart from each other by a distance larger than a diameter of said circular path taken by said rolling member, said pair of rolls maintaining a portion of said endless belt so as to extend in substantially parallel relation with said bearing surface of said table.

8. An image forming system according to claim 1, further comprising a recording medium which is superposed on said photosensitive medium such that said recording medium is held in contact with a portion of said surface of the photosensitive medium coated with said photosensitive material, said first and second members of said developing device pressing the superposed recording medium and photosensitive medium, so as to develop said latent image on said surface of the photosensitive medium, into said visible image formed on said recording medium, said endless belt indirectly contacting said portion of said surface of said photosensitive medium via said recording medium, and directly contacting an exposed portion of said surface of said photosensitive medium which is left uncovered by said recording medium.

9. An image forming system according to claim 8, wherein said recording medium comprises a developer sheet which has a developer layer containing a developer material which is capable of chemically reacting with said photosensitive material of said photosensitive medium, and thereby producing said visible image.

* * * * *